United States Patent
Osakabe et al.

[11] Patent Number: 5,871,043
[45] Date of Patent: Feb. 16, 1999

[54] COOLING APPARATUS USING BOILING AND CONDENSING REFRIGERANT

[75] Inventors: Hiroyuki Osakabe, Chita-gun; Kiyoshi Kawaguchi, Toyota; Masahiko Suzuki, Hoi-gun; Kazuma Matsui, Toyohashi, all of Japan

[73] Assignee: Nippondenso Co., Ltd., Kariya, Japan

[21] Appl. No.: 807,649

[22] Filed: Feb. 27, 1997

Related U.S. Application Data

[63] Continuation of Ser. No. 524,437, Sep. 6, 1995, abandoned.

[30] Foreign Application Priority Data

Sep. 6, 1994 [JP] Japan ................................ 6-212933

[51] Int. Cl.$^6$ ........................................ F28D 15/00
[52] U.S. Cl. ........................ 165/104.21; 165/104.33; 257/715; 361/700
[58] Field of Search .............. 165/104.33, 104.21, 165/80.4; 257/715; 361/700

[56] References Cited

U.S. PATENT DOCUMENTS

| | | | |
|---|---|---|---|
| 4,549,603 | 10/1985 | Shirai et al. | 165/104.33 |
| 4,944,344 | 7/1990 | Crowe | 165/104.33 |
| 4,949,164 | 8/1990 | Ohashi et al. | 165/104.33 X |
| 5,076,351 | 12/1991 | Munekawa et al. | 165/104.21 |

FOREIGN PATENT DOCUMENTS

| | | | |
|---|---|---|---|
| 3132112 | 3/1982 | Germany | 361/700 |
| 3145141 | 12/1978 | Japan | 165/104.33 |
| 57-204156 | 12/1982 | Japan . | |
| 9141255 | 8/1984 | Japan | 257/715 |
| 329181 | 4/1991 | Japan . | |
| 0957449 | 9/1982 | U.S.S.R. | 257/715 |
| 1660229 | 6/1991 | U.S.S.R. | 361/700 |

*Primary Examiner*—Ira S. Lazarus
*Assistant Examiner*—Christopher Atkinson
*Attorney, Agent, or Firm*—Cushman Darby & Cushman IP Group of Pillsbury Madison & Sutro LLP

[57] ABSTRACT

An IGBT module has an IGBT element. Within a refrigerant tank is sealed refrigerant. On the bottom part of the refrigerant tank is provided the IGBT module. The heat emitted from the IGBT element is absorbed by the refrigerant by the transmission of the boiling heat emitted from the IGBT element and the refrigerant is gasified by the absorbed heat. A radiation tube is communicated with the refrigerant tank at one end and blocked at the other end. Within the radiation tube is disposed corrugated inner fins, and an upper space, refrigerant passages through for guiding the refrigerant from the refrigerant tank into the upper space, and thin holes in which a liquid pooling part for returning the refrigerant from the upper space into the refrigerant tank is formed are dividingly formed respectively.

11 Claims, 19 Drawing Sheets

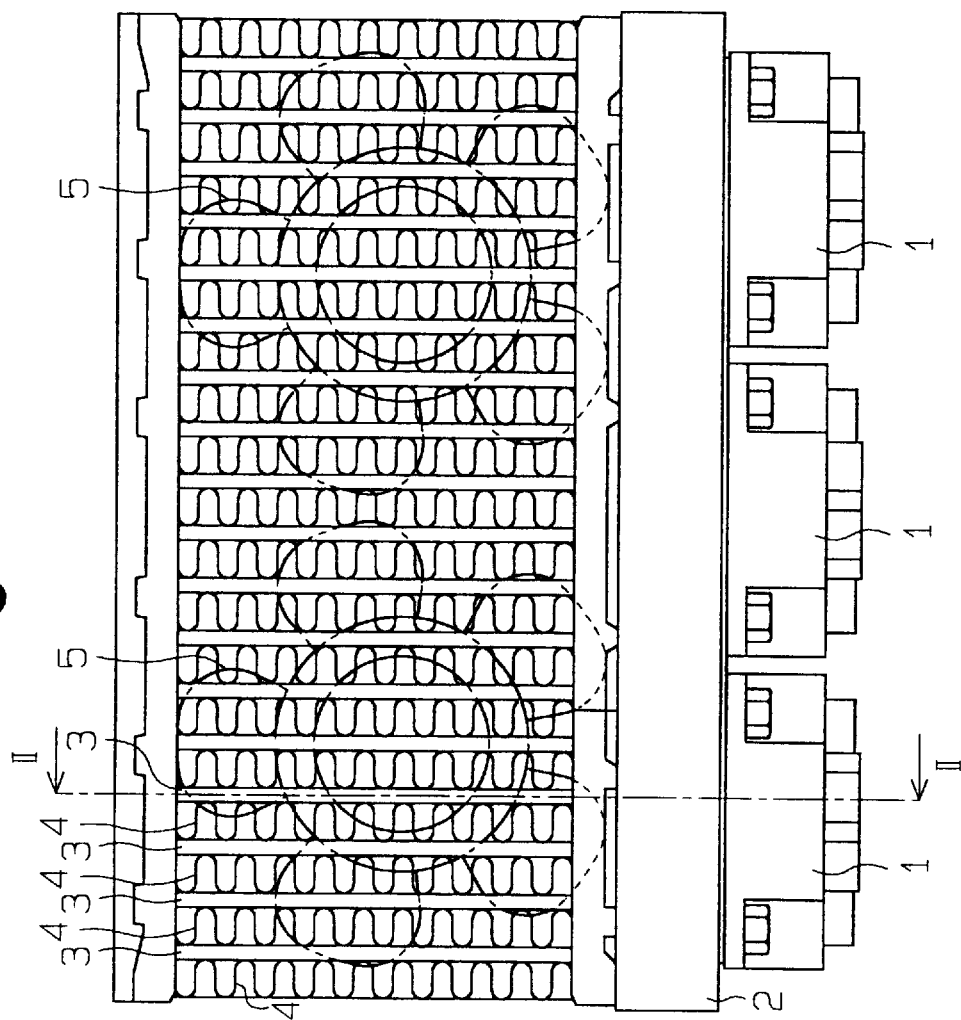
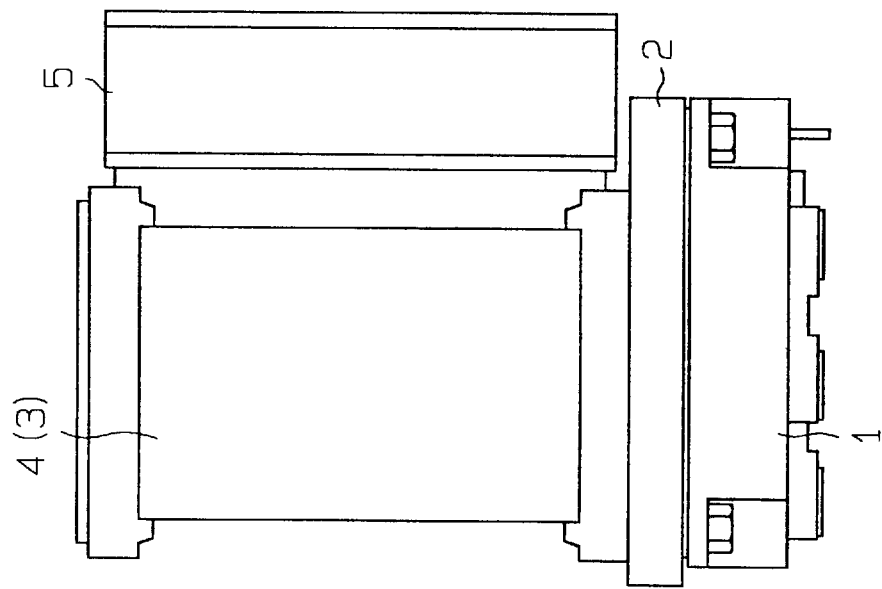

COOLING APPARATUS USING BOILING AND CONDENSING REFRIGERANT

This is a continuation of application Ser. No. 08/524,437, filed Sep. 6, 1995, now abandoned.

CROSS REFERENCE OF RELATED APPLICATION

This application is based upon and claims priority from Japanese Patent Application No. Hei 6-212933 filed Sep. 6, 1994, of which the contents are incorporated herein by reference.

BACKGROUND OF THE INVENTION

1. Field of the Invention

The present invention generally relates to cooling apparatus using boiling refrigerant, and more particularly to a cooling apparatus using boiling and condensing refrigerant which cools a heating element, such as heated semiconductor element.

2. Description of the Related Art

As a conventional apparatus for cooling semiconductor elements which generate heat while being driven, there has been a technique disclosed in the Japanese Examined Patent Publication No. 3-29181, for example. This technique is embodied as a hermetic siphon system in which the heat generated by a semiconductor element is absorbed by refrigerant, thereby the refrigerant is gasified and rises through a radiation part, then the heat is radiated to the outside from the radiation part, and in this way the semiconductor element is cooled.

In such apparatus, inner fins vertically laid out within the radiation part is formed so that the heat emitted from the refrigerant can easily be absorbed by the radiation part.

However, according to the apparatus disclosed in the Japanese Examined Patent Publication No. 3-29181, as the boiled and gasified vapor rising flow and the condensed and liquefied return flow run reverse, these flows turn into the what is called flushed state as the vapor velocity increases. This makes the liquid flow impossible to further return, and poses a problem that the maximum heat transportation rate is lowered.

Another technique has been disclosed in the Japanese Patent Application Laid-Open No. 57-204156, in which a passage is formed for passing therethrough the boiled and gasified refrigerant and a passage is formed for passing therethrough the condensed and liquefied refrigerant within the radiation part. According to this technique, inner fins are formed at vertically uniform intervals within the radiation part and a special sheet member is arranged at the under part of the inner fins to actively guide the boiled and gasified refrigerant into any of the inner fins. This publication also carries a statement that a plurality of special pipes are arranged outside the radiation part for use as passages for passing therethrough the boiled and gasified refrigerant and as passages for passing therethrough the condensed and liquefied refrigerant.

However, according to the technique disclosed in the Japanese Patent Application Laid-Open No. 57-204156, the special sheet member is disposed at the under part of the inner fins to actively guide the boiled and gasified refrigerant into any of the inner fins. This poses a problem that not only additional man-hour would be required for installation of such special sheet member but also, as the inner fins into which the boiled and gasified refrigerant is guided are constructed to comparatively be narrow, efficient cooling can not be achieved.

SUMMARY OF THE INVENTION

In view of the above, it is an object of the present invention to provide a cooling apparatus using boiling and condensing refrigerant having inner fins within a radiation part which can easily be formed without requiring any special member or process and in which liquid flow can smoothly return and heat transportation rate can be increased.

A cooling apparatus using boiling and condensing refrigerant includes a heating element, a refrigerant tank, a radiation part, and a refrigerant passage forming members. The heating element generates heat due to electric energizing thereof. The refrigerant tank reserves refrigerant which absorbs heat emitted by the heating element and is gasified by the heat. One end of the radiation part is communicated with said refrigerant tank and the other end of the radiation part is closed. The radiation part condenses the gasified refrigerant and returns the same into the refrigerant tank. The refrigerant passage forming members is composed of sheet members arranged within the radiation part for dividingly forming an upper space which is a space at the upper part of the radiation part, a first refrigerant passage which guide the gasified refrigerant from the refrigerant tank into the upper space and a second refrigerant passages which return the gasified refrigerant from the upper space into the refrigerant tank and in which a liquid pooling part is formed on the way with the liquefied refrigerant. The second refrigerant passage is smaller in cross section than the first refrigerant passage.

According to the present invention, the refrigerant passage forming members arranged within the radiation part dividingly form the upper space, the first refrigerant passages and the second refrigerant passages. When the heating element used for electric circuit or the like is electrically energized, heat is generated thereby. The heat generated by the heating element is absorbed by the refrigerant within the refrigerant tank, and the refrigerant is gasified by the absorbed heat. The gasified refrigerant is guided into the upper space through the first refrigerant passages formed with the refrigerant passage forming members, and then returned from the upper space into the refrigerant tank through the second refrigerant passages. During this travel of the refrigerant, the gasified refrigerant is cooled and liquefied, and a liquid pooling part is formed in the second refrigerant passages on the way with the liquefied refrigerant. Thereafter, in the state with the liquid pooling part formed in the second refrigerant passages on the way, the refrigerant runs from the refrigerant tank through the first refrigerant passages into the upper space and returns from the upper space through the second refrigerant passages into the refrigerant tank.

In this way, a circulation passage of the refrigerant is formed with the refrigerant passage forming members with the upper space and the first and second refrigerant passages, and the liquid flow can smoothly return and the maximum heat transportation rate can be increased without any reverse of the gasified rising refrigerant and liquefied falling refrigerant.

Furthermore, the above liquid pooling part vibrates for the reasons that (1) there is a time-lag between the refrigerant which directly acts on the liquid pooling part of all the refrigerant gasified within the refrigerant tank and the refrigerant which passes through the first refrigerant passages and acts on the liquid pooling part, and this time-lag causes the vibration and (2) air bubbles are intermittently generated in the refrigerant within the refrigerant tank, and these air bubbles hit the liquid pooling part and thrust up the liquid pooling part. This vibration of the liquid pooling part allows heat transmission by a forced convection and thereby improve the heat radiability.

Preferably, any one of the second refrigerant passages is smaller in cross section than any one of the first refrigerant passages, and therefore the liquid pooling part can easily be formed.

Preferably, as any one of the second refrigerant passages is narrower in the width of the narrowest part of the cross section than any one of the first refrigerant passages, so that the liquid pooling part can easily be formed.

BRIEF DESCRIPTION OF THE DRAWINGS

FIG. 1A is a front view illustrating a cooling apparatus using boiling refrigerant;

FIG. 1B is a side view of FIG. 1A;

FIG. 20 18 is a cross-sectional view of a cooling apparatus using boiling refrigerant according to the sixth embodiment;

DETAILED DESCRIPTION OF THE PREFERRED EMBODIMENTS (First Embodiment)

In the following passages, the first embodiment according to the present invention will be described referring to the appended drawings.

Figure 2:
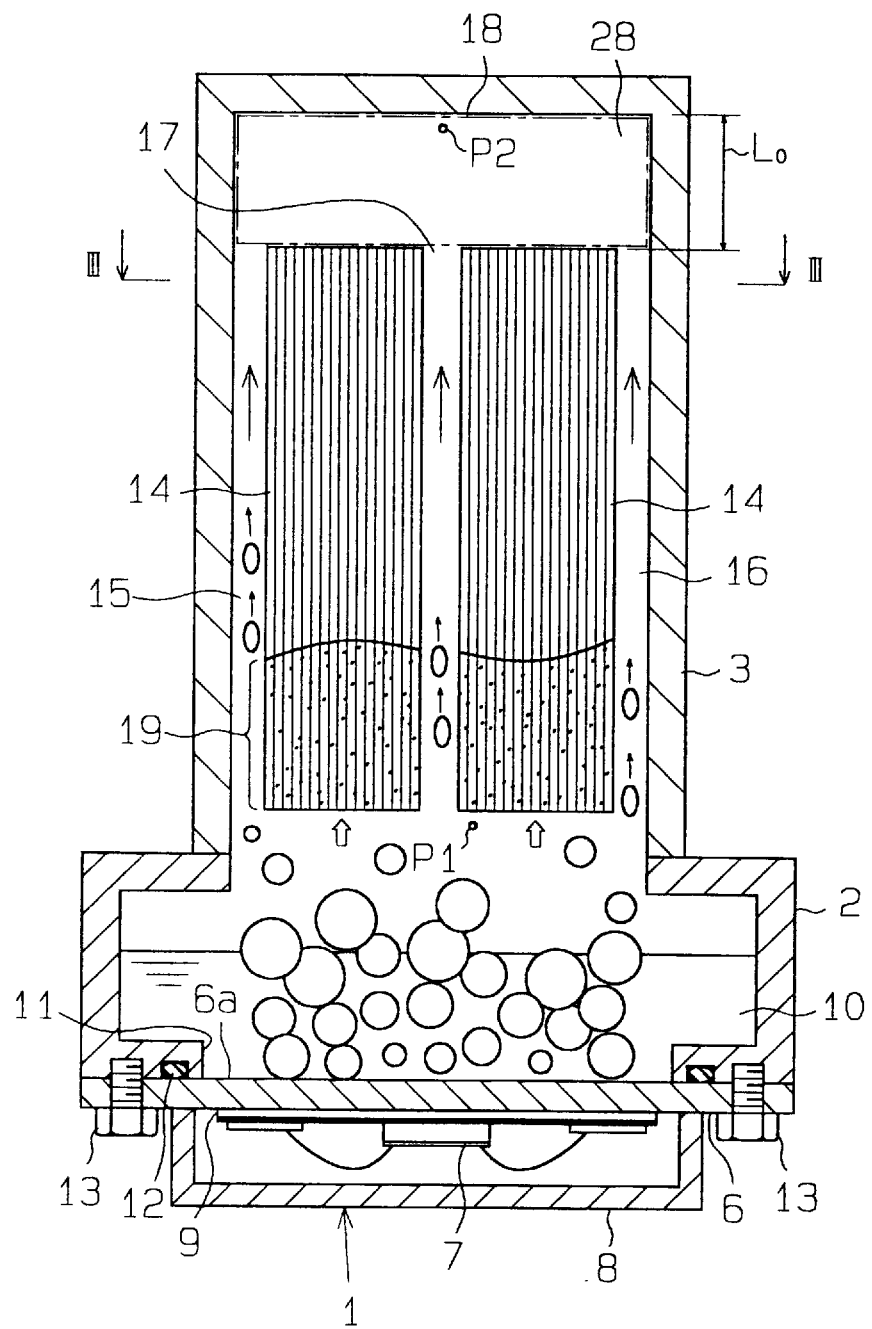
FIG. 2 is a cross-sectional view taken along line II—II of FIG. 1A.
Figure 3:
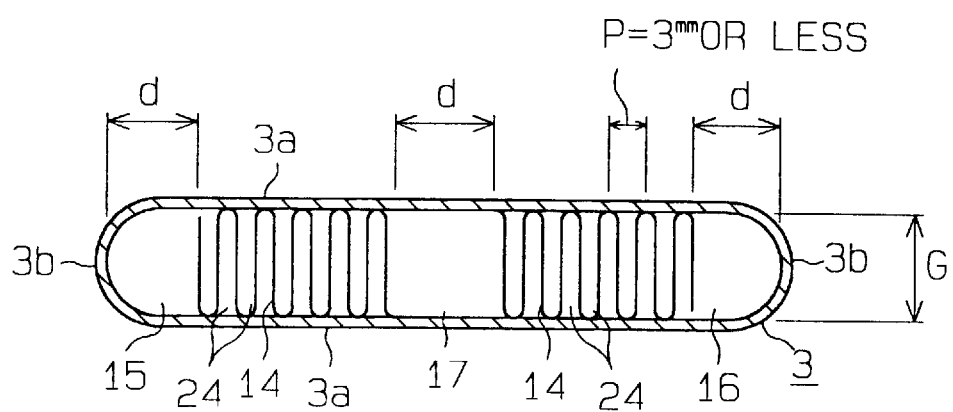
FIG. 3 is a cross-sectional view taken along line III—III of FIG. 2.
Figure 4:
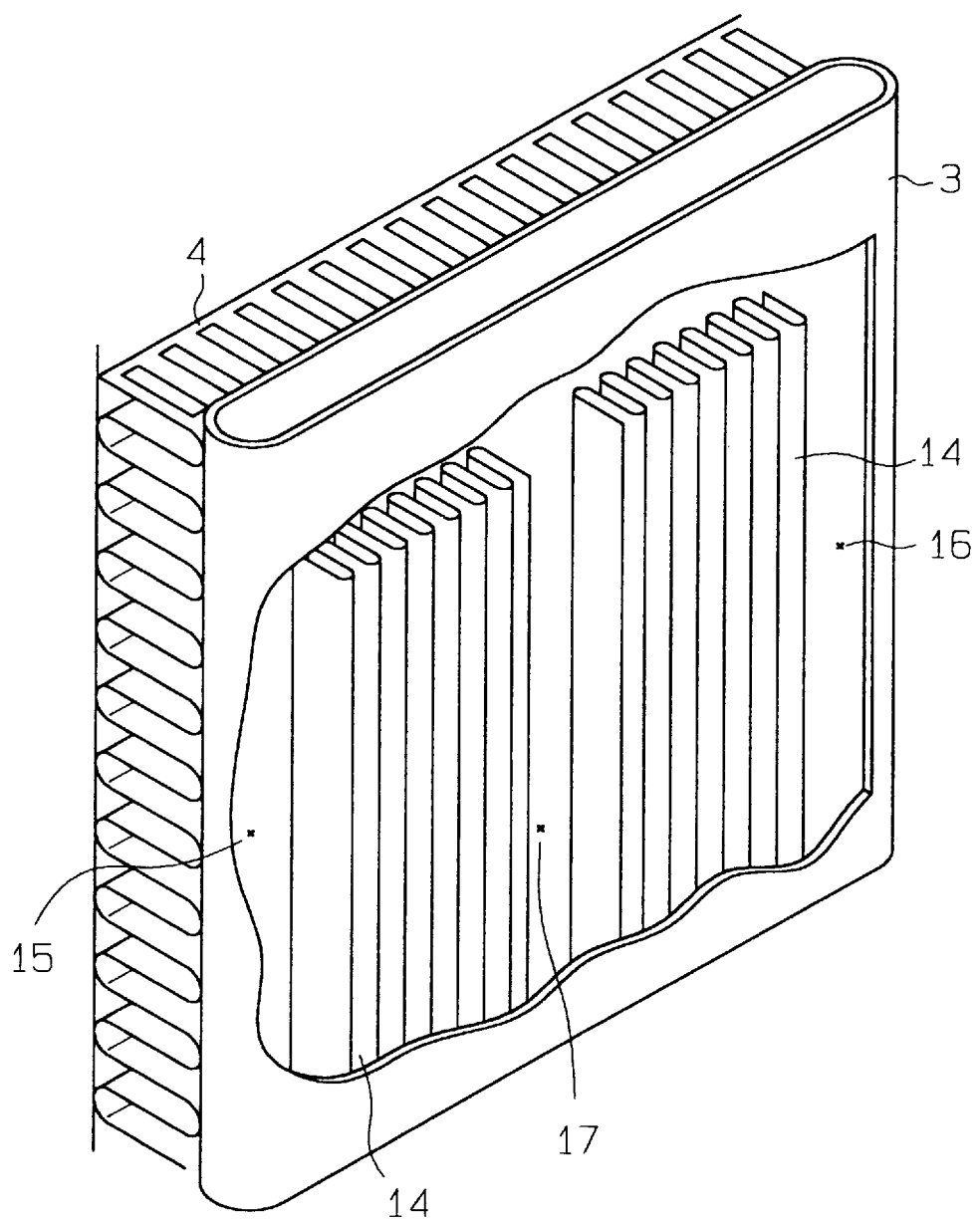
FIG. 4 is a perspective view illustrating a radiation tube and radiation fins.

FIG. 1A is a front view of a cooling apparatus using boiling refrigerant according to this embodiment, FIG. 1B is a side view of the cooling apparatus using boiling refrigerant. FIG. 2 is a cross-sectional view of the cooling apparatus using boiling refrigerant taken along line II—II of FIG. 1A. FIG. 3 is a cross-sectional view of the cooling apparatus using boiling refrigerant taken along line III—III of FIG. 2. FIG. 4 is a perspective view of a radiation tube 3 and radiation fins 4 (both described later).

As illustrated in FIG. 1, this apparatus includes IGBT modules 1, a refrigerant tank 2, a numerosity of radiation tubes 3, radiation fins 4 and cooling fans 5. As illustrated in FIG. 2, each IGBT (Insulated-Gate Bipolar Transistor) module 1 includes a radiation panel 6, an IGBT element (power element) 7 as a heating element, a cap 8 and an insulating board 9. To the bottom surface of the radiation panel 6 is bonded the IGBT element 7 through the insulating board 9, and the IGBT element 7 is packaged with the cap 8. Including the IGBT element 7, an electric circuit is constructed. When the electric circuit is driven (electrically energized), the IGBT element 7 generates heat, and the heat emitted from the IGBT 7 is transmitted to the radiation panel 6 through the insulating board 9.

The refrigerant tank 2 is made of aluminum. In the refrigerant tank 2 is sealed refrigerant 10. As the refrigerant 10, water is used according to this embodiment. The water is sealed in the refrigerant tank 2 in the pressure reduced condition to approximately 0.01 MPa. In the bottom part of the refrigerant tank 2 is made an opening part 11. As if to block this opening part 11 from the lower side, the radiation panel 6 of the IGBT module 1 is applied to the bottom part of the refrigerant tank 2, and airtightly fixed thereto by bolts 13 through an O-ring 12. The top surface of this radiation panel 6 provides a radiation surface 6a. The radiation surface 6a is thermally bonded to the IGBT element 7 and concurrently in contact with the refrigerant 10. The heat emitted from the IGBT element 7 is absorbed by the refrigerant by the transmission of boiling heat, and the refrigerant 10 is gasified by the absorbed heat.

On the top surface of the refrigerant tank 2 are mounted the numerosity of aluminum radiation tubes 3 which extend upward therefrom. As illustrated in FIG. 3, each radiation tube 3 is flatly shaped. The radiation tube 3 is composed of parallel parts 3a and semicircular parts 3b at the distal ends of the parallel parts 3a. Each radiation tube 3 is laid out with the longitudinal axis thereof being parallel with the longitudinal axes of the other radiation tubes 3. As illustrated in FIG. 2, the lower end of the radiation tube is communicated with the refrigerant tank 2 and the upper end thereof being blocked. The refrigerant 10 gasified within the refrigerant tank 2 rises through the radiation tube 3, and when contacting the low-temperature inner surface of the radiation tube 3, condenses and emits latent heat, and concurrently cools and liquefies, and then returns into the refrigerant tank 2. This radiation tube 3 composes a cylindrically shaped radiation part.

Furthermore, on the outer circumferential part of the parallel part 3a of the radiation tube 3 are mounted the aluminum radiation fins 4 by means of brazing so that the heat emitted from the radiation tube 3a can be transmitted to the radiation fins 4. In this embodiment, as the radiation fins 4, corrugated fins are used.

The refrigerant tank 2 has a structure equivalent to a pressure container which is strong enough to withstand the deformation due to the inner pressure thereof, and is bonded to the radiation tubes 3 by some bonding means which does not permit the leak of the refrigerant 10 (e.g., brazing).

As illustrated in FIGS. 1A and 1B, on the back surface side of the arrangement part of the radiation tubes 3 are mounted cooling fans 5 so that the driving of the cooling fans 5 can allows the air (atmosphere) to cool the outer circumferential part of the radiation tubes 3 and the radiation fins 4 by passing therethrough.

As illustrated in FIGS. 2, 3 and 4, within the radiation tube 3 are provided inner fins 14 of corrugated sheet shape as refrigerant passage forming members. These inner fins 14 are made of aluminum corrugated sheets. As illustrated in FIG. 3, the pitch (distance between the adjoining crests or roots) P of each inner fin 14 should preferably be approximately 3 mm or less when water is used as the refrigerant 10. The corrugated inner fins 14 are inserted into the radiation tube 3 and so arranged that the direction of the crests and roots thereof coincides with the direction in which the radiation tube 3 extends On the other hand, the crests and roots of the corrugated inner fins 14 are in contact with the inner wall surfaces of the radiation tube 3, and these contact parts are bonded by means of brazing to fix the corrugated inner fins 14 to the radiation tube 3. These corrugated inner fins 14 dividingly form thin holes 24 extending in the direction in which the radiation tube 3 extends.

When these corrugated inner fins 14 are used, and when the inner distance between the parallel parts 3a of the radiation tube 3 is G and the pitch (distance between the adjoining crests or roots) of the inner fin 14 is P, the cross section of the refrigerant passage (cross section of the thin hole 24) is roughly rectangular with one side of G and the other side of P/2 in which the width of the narrowest part is P/2.

Each unit of the corrugated inner fins 14 is composed of a pair of sheets which are arranged within the radiation tube 3 so that clearances can be provided at both ends and at the central part. These clearances provided at both ends and at the central part form refrigerant passages 15 through 17 respectively. As illustrated in FIG. 3, the widths d of the refrigerant passages 15 through 17 are wider than the width P/2 of the narrowest part of the inner fin 14.

Furthermore, as illustrated in FIG. 2, the corrugated inner fins 14 are laid out within the radiation tube 3 to be lower by a specified distance Lo from the inner top surface of the radiation tube 3 and an upper space 18 is formed between the inner top surface of the radiation tube 3 and the corrugated inner fins 14.

As described above, the refrigerant passages (first refrigerant passages) 15 through 17 for guiding the refrigerant 10 from the refrigerant tank 2 to the upper space 18, the thin holes (second refrigerant passages) 24, which are smaller in unit cross section than the refrigerant passages 15 through 17, for returning the refrigerant 10 from the upper space 18 into the refrigerant tank 2, and the upper space 18 are dividingly formed with the corrugated inner fins 14 arranged within the radiation tube 3.

Now, the mode of operation of the cooling apparatus of the above construction will be described.

When the IGBT element (power element) 7 within the IGBT module 1 generates heat, the heat is transmitted to the radiation surface 6a of the radiation panel 6, and further to the refrigerant 10 within the refrigerant tank 2 by the transmission of the boiling heat. Consequently, the refrigerant 10 is gasified into vapor. The gasified refrigerant 10 rises through the radiation tube 3 by way of the refrigerant passages 15 through 17 to the upper space 18 within the radiation tube 3. The gasified refrigerant 10 then condenses and thereby transmits the heat and concurrently liquefies within the upper space 18 and at the lower part of the upper space 18. Then, the condensed refrigerant 10 returns into the refrigerant tank 2 by way of the thin holes (inner clearance) 24 of the corrugated inner fins 14. A part of the condensed refrigerant 10 forms a liquid pooling part 19 due to the surface tension at the lower part of the corrugated inner fins 14. The liquid pooling part 19 is also formed when air bubbles generated within the refrigerant tank 2 rises and directly hits the lower surface of the corrugated inner fins 14 and thereby the liquid films of the air bubble are caught by the lower part of the corrugated inner fins 14 due to the surface tension. To be more specific, when the refrigerant 10 is boiled, air bubbles are generated from the refrigerant 10 within the refrigerant tank 2 and blown upward to the corrugated inner fins 14 and contact the corrugated inner fins 14. At this time, a part of the liquid films of the air bubbles form the liquid pooling part 19 due to the surface tension at the lower part of the corrugated inner fins 14.

When the vapor rises by way of the refrigerant passages 15 through 17, a part of the liquid refrigerant 10 at the liquid pooling part 19 is thrust aside and fallen into the refrigerant tank 2. A circulation flow is formed with upward outbound vapor flow and downward inbound liquid flow in this way, and even when vapor accelerates or increases, the returning liquid flow is so smooth as to increase the maximum heat transportation rate.

Figure 5:
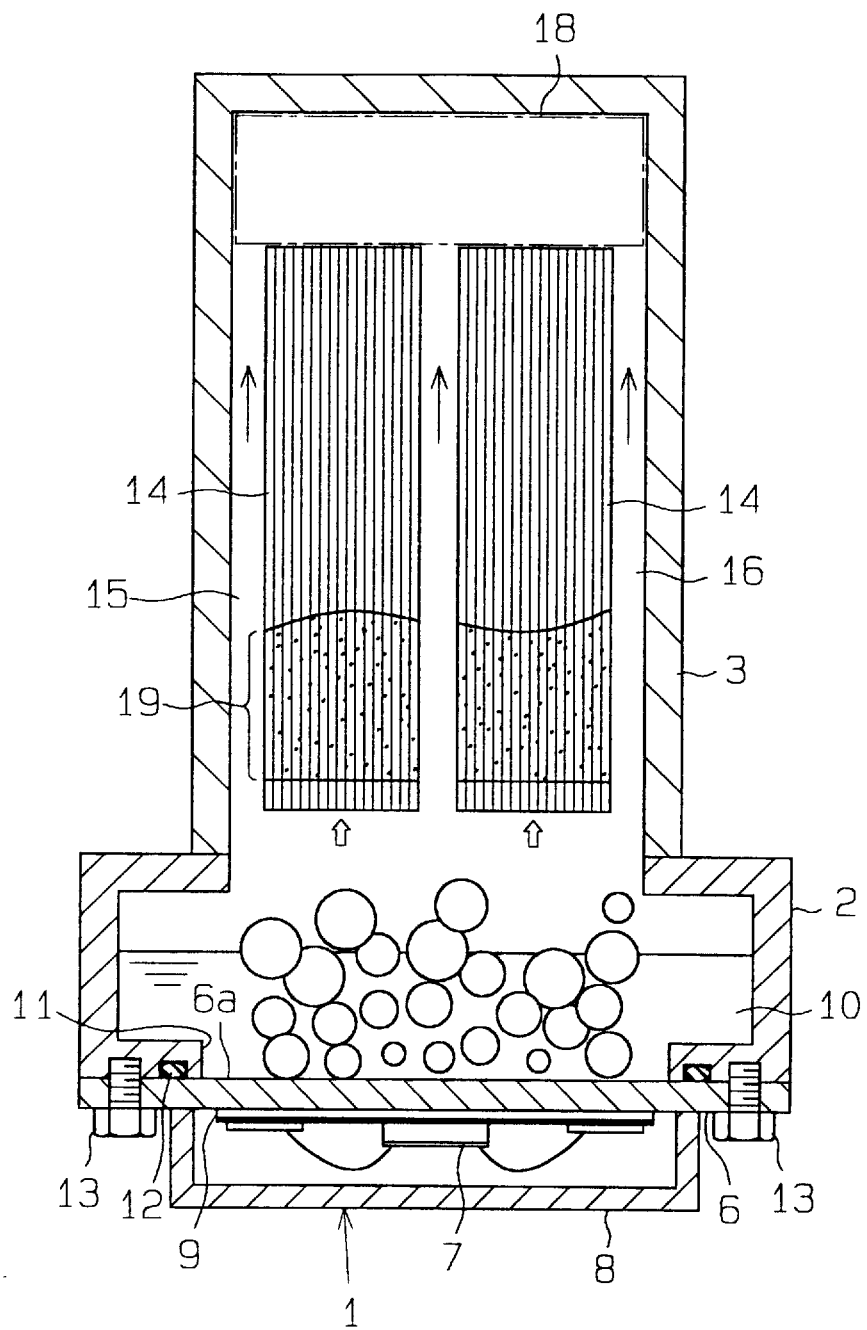
FIG. 5 is a cross-sectional view depicting the mode of operation of the cooling apparatus using boiling and condensing refrigerant according to the first embodiment.

On the other hand, the liquid pooling part 19 vibrates up and down. Specifically, the liquid pooling part 19 rises from the state illustrated in FIG. 2 in which the liquid pooling part 19 is at the lowest part of the corrugated inner fins 14 to the state illustrated in FIG. 5 in which the liquid pooling part 19 has risen from the lowest part of the corrugated inner fins 14, and by repeating the transition between these two states illustrated in FIGS. 2 and 5 alternatingly, the liquid pooling part 19 vibrates up and down. This vibrational motion of the liquid pooling part 19 is caused by two factors. The first factor is a phase difference (time lag) of a vapor flow of the refrigerant 10 gasified within the refrigerant tank 2 between a vapor flow of directly acting on the liquid pooling part 19 and the other vapor flow of acting on the liquid pooling part 19 after rising through the refrigerant passages 15 through 17. The second factor is the intermittent generation of air bubbles from the refrigerant 10 within the refrigerant tank 2 which hits the liquid pooling part 19 at the lower part of the corrugated inner fins 14 and thrusts up the liquid pooling part 19. The vertical vibration of this liquid pooling part 19 causes a convection at the liquid pooling part 19, and heat transmission by this forced convection transmits the heat to the inner wall surface of the radiation tube 3.

In addition to the above, as the corrugated inner fins 14 are provided within the radiation tube 3, the radiation area increases, and compared with a case where there is no corrugated inner fins 14, the efficiency of the radiation from the refrigerant to the radiation tube 3 can be improved.

Figure 6:
FIG. 6 is a graph depicting the time-wise change in the liquid level of the liquid pooling part of the cooling apparatus using boiling and condensing refrigerant according to the first embodiment.
Figure 7:
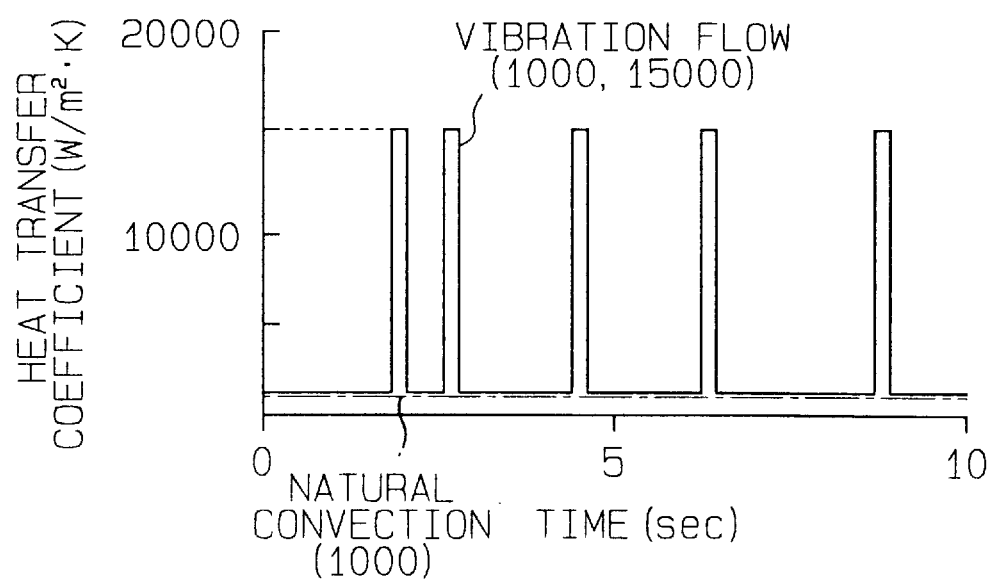
FIG. 7 is a graph depicting the time-wise change in the heat transfer coefficient of the cooling apparatus using boiling and condensing refrigerant according to the first embodiment.

FIG. 6 illustrates the time-wise change in the liquid level of the liquid pooling part 19 obtained through a visual video. From this figure, it is understood that a vibration flow was caused at an average interval of approximately 2 sec with an amplitude of approximately 5 mm and a cycle of approximately 0.1 sec. FIG. 7 illustrates the time-wise change in heat transfer coefficient. From this figure, it is understood that although the heat transfer coefficient is 1000 W/m$^2$-K in a natural convection, when the vibration flow is caused as is in this embodiment, the heat transfer coefficient ranges from 1000 W/m$^2$-K to 15000 W/m$^2$-K, which is approximately 15 times the heat transfer coefficient in the natural convection. Therefore, it is apparent that when the vibration flow is caused, the average heat transfer coefficient can be increased and thereby the radiation performance can be improved.

As described above, the corrugated inner fins (refrigerant passage forming members) 14 are disposed within the radiation tube 3, the refrigerant passages (first refrigerant passages) 15 through 17 for guiding the refrigerant 10 from the refrigerant tank 2 into the upper space 18, the thin holes (second refrigerant passages) 24 for returning the refrigerant 10 from the upper space 18 into the refrigerant tank 2 and forming the liquid pooling part 19 with the liquefied refrigerant 10 on the way, and the upper space 18 are dividingly formed. As a result, the circulation passage of the refrigerant 10 is formed, and without any reverse of the rising gasified refrigerant 10 and falling liquefied refrigerant 10, the liquid flow smoothly returns into the refrigerant tank 2, and thereby the maximum heat transportation rate can be increased.

Furthermore, due to the vibration of the liquid pooling part 19, heat transmission by forced convection is made, and thereby the heat radiability is improved. In addition, as the corrugated inner fins 14 are used for making the thin holes 24, the thin holes 24 can easily be made.

Moreover, a plurality of the first refrigerant passages 15 through 17 are formed and a plurality of the thin holes 24 are also made, and the thin holes 24 are smaller in passage cross section than that of the first refrigerant passages 15 through 17. Therefore, the liquid pooling part 19 can easily be formed.

(Second Embodiment)

Next, the second embodiment according to the present invention will be described focusing on differences from the first embodiment.

Figure 8:
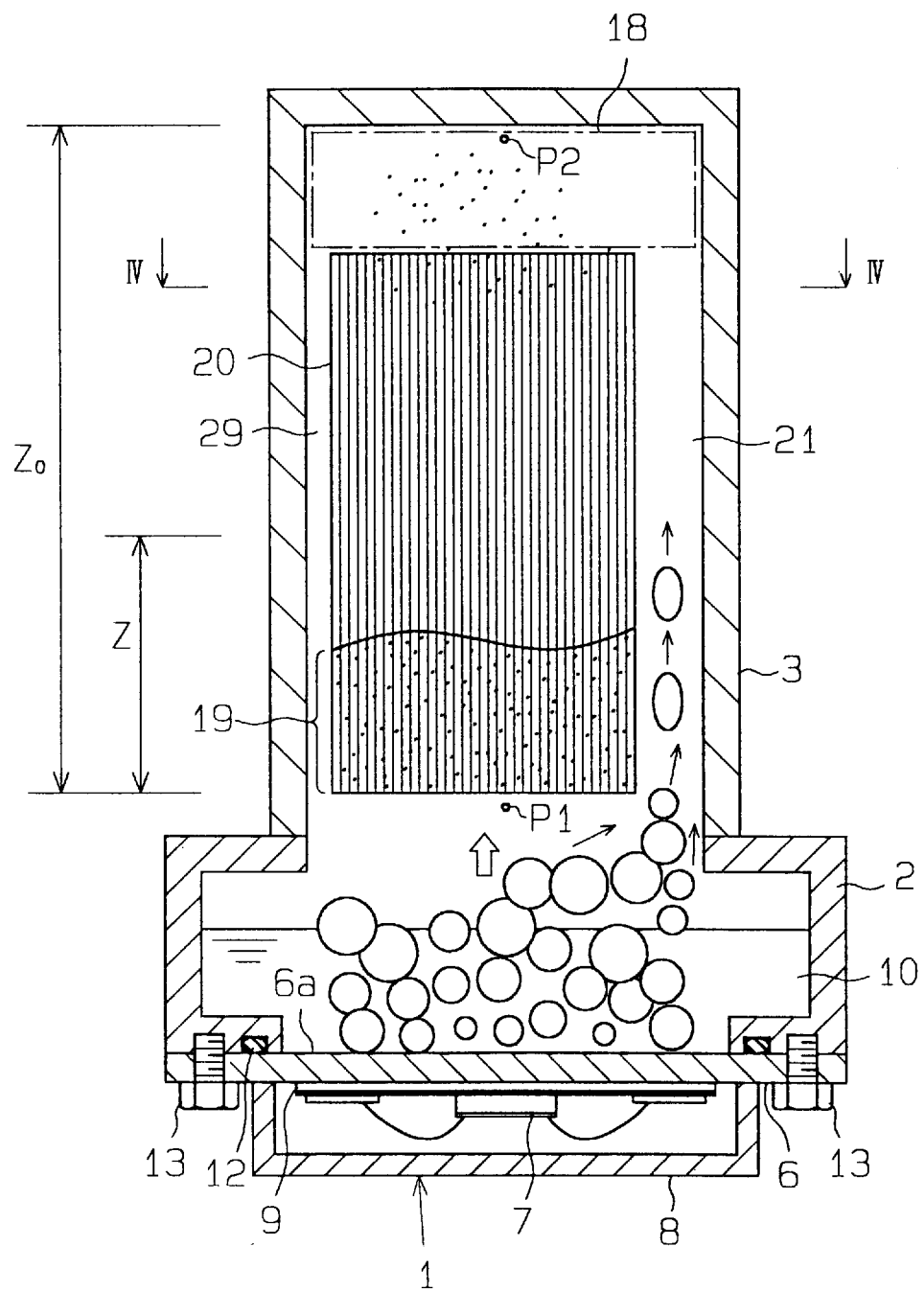
FIG. 8 is a cross-sectional view of a cooling apparatus according to the second embodiment.
Figure 9:
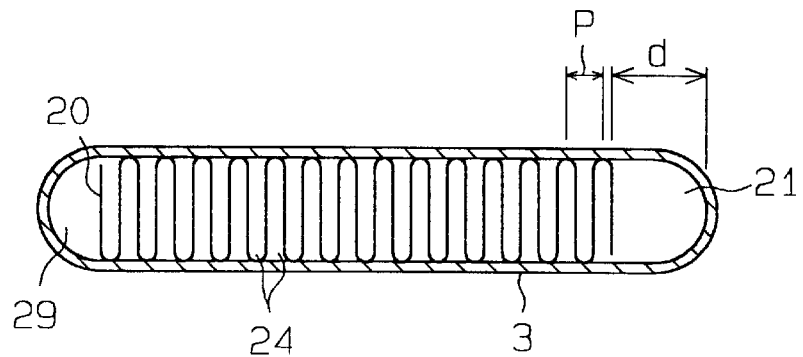
FIG. 9 is a cross-sectional view taken along line IX—IX of FIG. 8.

FIG. 8 is a counterpart of FIG. 2 of the first embodiment, and FIG. 9 is a cross-sectional view taken along line IX—IX of FIG. 8.

Within the radiation tube 3 are disposed corrugated inner fins 20. These corrugated inner fins 20 are made of aluminum corrugated sheets, and the pitch P thereof (distance between adjoining crests or roots) should preferably be approximately 3 mm or less. These corrugated inner fins 20 are inserted into the radiation tube 3 and so arranged that the direction of the crests and roots extend coincides with the direction in which the radiation tube 3 extends. On the other hand, the crests and roots of the corrugated inner fins 20 are in contact with the inner wall surface of the radiation tube 3, and these contact parts are bonded by means of brazing to fix the corrugated inner fins 20 to the radiation tube 3. These corrugated inner fins 20 are so arranged that a clearance is formed on one end part thereof within the radiation tube 3. This clearance forms a refrigerant passage 21 (first refrigerant passage). The refrigerant passage 21 has a width d (e.g., 8 mm) which is wider than the width P/2 (e.g., 0.85 mm) of the narrowest part of the passage cross section of the thin hole 24.

Furthermore, as illustrated in FIG. 8, the corrugated inner fins 20 are so arranged within the radiation tube 3 as to be positioned lower than the inner top surface of the radiation tube 3, and the upper space 18 is formed between the inner top surface of the radiation tube 3 and the corrugated inner fins 20.

Now, the mode of operation of the cooling apparatus using boiling and condensing refrigerant so constructed as described above will be explained.

The heat emitted from the IGBT element (power element) 7 within the IGBT module 1 is transmitted to the radiation surface 6a of the radiation panel 6, and further to the refrigerant 10 within the refrigerant tank 2 by the transmission of the boiling heat. Consequently, the refrigerant 10 is gasified into vapor. The gasified refrigerant 10 rises through the radiation tube 3 by way of the refrigerant passage 21 to the upper space 18 within the radiation tube 3. The gasified refrigerant 10 then condenses, and thereby transmits the heat and concurrently liquefies within the upper space 18 and at the lower part of the upper space 18. Then, the condensed refrigerant 10 returns into the refrigerant tank 2 by way of the thin holes (inner clearance) 24 of the corrugated inner fins 14. A part of the condensed refrigerant 10 forms the liquid pooling part 19 due to the surface tension at the lower part of the corrugated inner fins 20. When the vapor rises through the refrigerant passage 21, a part of the liquid refrigerant at the liquid pooling part 19 is thrust aside therefrom and returned into the refrigerant tank 2. On the other hand, the liquid pooling part 19 is vibrating up and down, and the heat is transmitted to the inner wall surface of the radiation tube 3 by the heat transmission due to the forced convection caused by this vibration.

Here, according to the first embodiment, as there are three first refrigerant passages (15 through 17) which lead from the refrigerant tank 2 to the upper space 18, and on account of this construction, there are three refrigerant flows and these three refrigerant flows collide against each other in the upper space 18. On the other hand, according to this second embodiment, although there are two first refrigerant passages (21 and 29), the refrigerant passage 21 is larger in cross section and therefore smaller in flow resistance (passage resistance) than the refrigerant passage 29. Accordingly, the gasified refrigerant 10 rises mainly through the refrigerant passage 21. Through this refrigerant passage 21, circulation flow is formed, liquid flow can smoothly be returned into the refrigerant tank 2, and thereby the maximum heat transportation rate can be increased.

Figure 10:
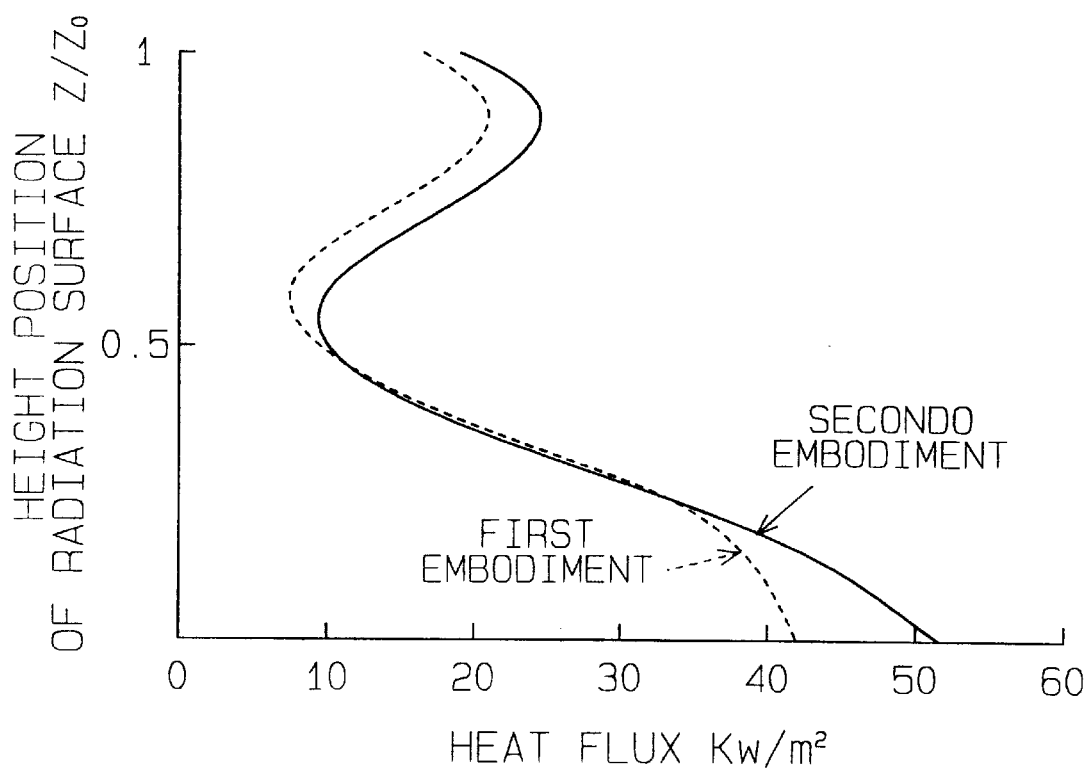
FIG. 10 is a graph depicting the heat flux in the direction of radiation surface height.

FIG. 10 illustrates heat flux distribution in the height direction of the radiation surface 6a when the temperature of the radiation surface 6a of the IGBT module 1 is constant. To be more specific, this figure illustrates the heat flux distribution when the height from the lower end of the corrugated inner fins 20 to the inner top surface of the radiation tube 3 is Zo and the position at the height Z from the lower end of the corrugated inner fins 20 is Z/Zo in FIG. 8. The solid line indicates the heat flux distribution when the corrugated inner fins 20 according to the second embodiment are used, and the broken line indicates the heat flux distribution when the corrugated inner fins 20 according to the first embodiment are used.

From FIG. 10, it is understood that the heat flux of the second embodiment is larger than the heat flux of the first embodiment at the upper part of the radiation surface (the upper part of the radiation tube 3) and the lower part of the radiation surface (the lower part of the radiation tube 3).

Here, the reason for the fact that the heat flux of the second embodiment is larger than the heat flux of the first embodiment at the upper part of the radiation surface (the upper part of the radiation tube 3) will be described. According to the first embodiment, there are three refrigerant passages (15 through 17) which lead from the refrigerant tank 2 to the upper space 18 and the vapor flows collide against each other in the upper space 18. On the other hand, according to the second embodiment, although there are two refrigerant passages (21 and 29), as the refrigerant 10 passes mainly through the refrigerant passage 21 which is larger in the passage cross section and smaller in the passage resistance than the refrigerant passage 29 and therefore there is no collision of the vapor flows. Accordingly, in the second embodiment, smooth circulation flow is formed and the heat flux increases as the rising vapor rate increases.

On the other hand, the reason for the fact the heat flux of the second embodiment is larger than the heat flux of the first embodiment at the lower part of the radiation surface (the lower part of the radiation tube 3) will be described referring to FIGS. 11, 12A, 12B, 13A and 13B.

Figure 11:
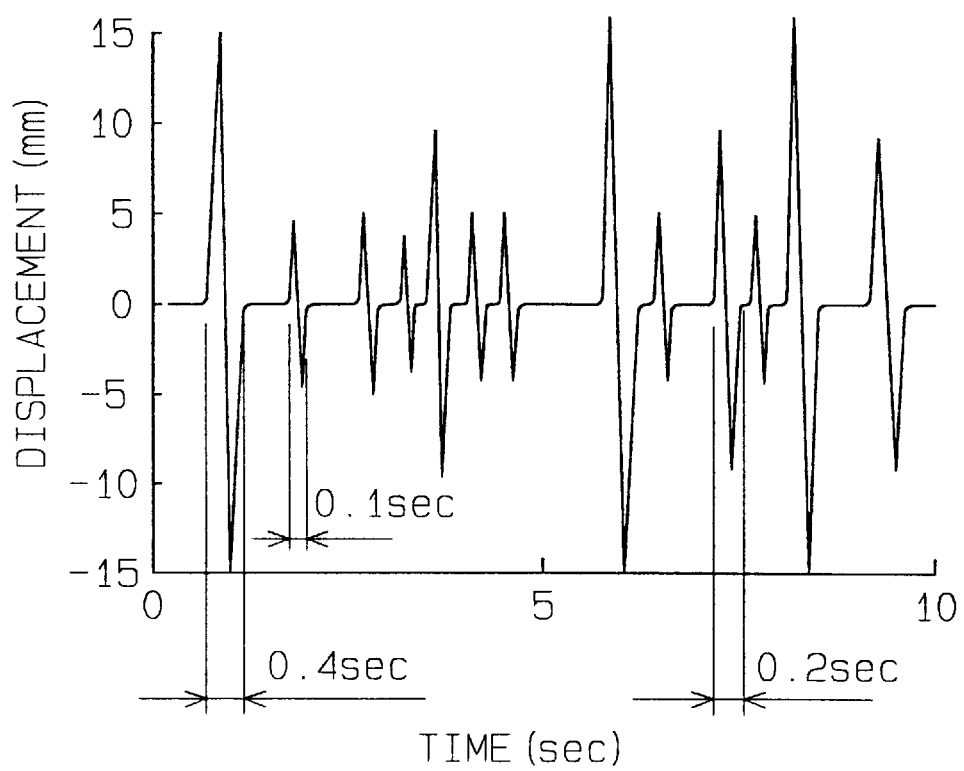
FIG. 11 is a graph depicting the time-wise change in the liquid level of the liquid pooling part of the cooling apparatus using boiling refrigerant according to the second embodiment.

FIG. 11 illustrates the time-wise change in the liquid level of the liquid pooling part 19 according to this embodiment. While the time-wise change in the liquid level of the liquid pooling part 19 according to the first embodiment illustrated in FIG. 6 is approximately 5 mm in amplitude, the maximum amplitude thereof according to the second embodiment illustrated in FIG. 11 is approximately 15 mm. From this comparison, it is understood that the liquid level of the liquid pooling part 19 according to this embodiment vibrates more greatly in comparison with the first embodiment, and a large flow phenomenon can be deduced.

Figure 12:
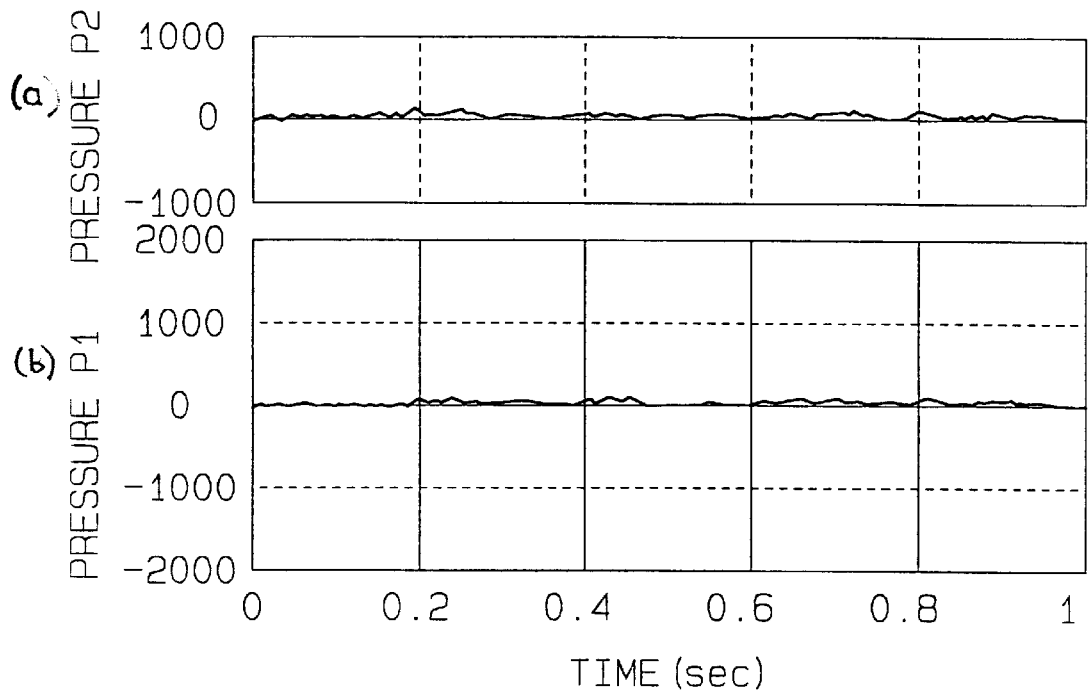
FIGS. 12A and 12B are graphs depicting the time-wise change in the refrigerant pressure of the cooling apparatus using boiling and condensing refrigerant according to the first embodiment.
Figure 13:
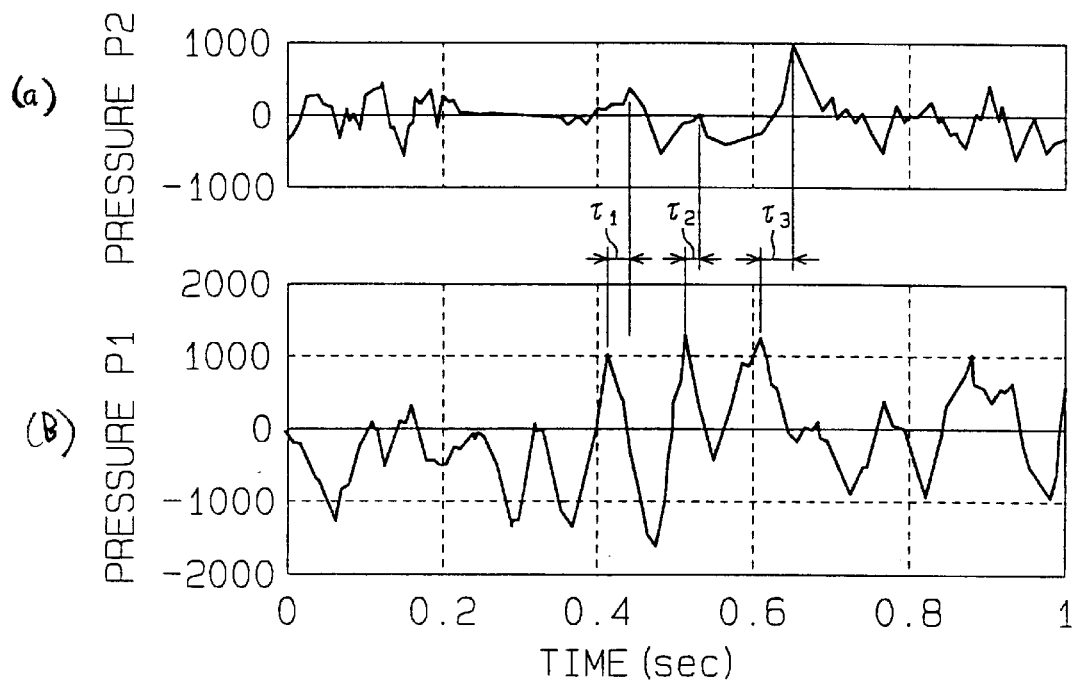
FIGS. 13A and 13B are graphs depicting the time-wise change in the refrigerant pressure of the cooling apparatus using boiling and condensing refrigerant according to the second embodiment.

FIGS. 12A and 12B illustrate the fluctuation in pressure in comparison between the pressure P1 at the lower end part within the radiation tube 3 and the pressure P2 at the upper end part within the radiation tube 3 according to the construction of the first embodiment (Refer to FIG. 2). FIGS. 13A and 13B illustrate the fluctuation in pressure in comparison between the pressure P1 at the lower end part within the radiation tube 3 and the pressure P2 at the upper end part within the radiation tube 3 according to the construction of the second embodiment (Refer to FIG. 8). The pressure fluctuation is small according to the construction of the first embodiment illustrated in FIGS. 12A and 12B, while the pressure fluctuation is large in the construction of the second embodiment illustrated in FIGS. 13A and 13B, and furthermore, due to the phase differences indicated by $\tau 1, \tau 2$ and $\tau 3$, alternating force is generated. The reason for the generation of the alternating force will now be described. Here, air bubbles pass through the wider refrigerant passage 21, and upon the release of the air bubbles from the refrigerant passage 21, the pressure at the upper part of the radiation tube 3 increases and the pressure at the lower part of the radiation tube 3 decreases. Therefore, it is deduced that an antiphase force acts on the liquid pooling part 19 and thereby the pressure greatly fluctuates at the upper end part and lower end part within the radiation tube 3. As a result, as illustrated in FIG. 11, the liquid level of the liquid pooling part 19 greatly vibrates.

From the above, it is deduced that the heat flux is large at the lower part of the radiation surface in FIG. 10 as vibration, which is larger in this embodiment than that of the first embodiment, is caused to the liquid pooling part 19 and convection (vibration flow) is promoted by the vibration.

In this way, by the great vertical vibration of the liquid pooling part 19 at the lower part of the radiation surface (lower part of the radiation tube 3), the development of the temperature boundary layer can be restrained and the heat can effectively radiated. Accordingly, without using any external force, the vibration can self-excitingly be increased and thereby the heat transfer coefficient can be improved.

As described above, according to this embodiment, two refrigerant passages 21 and 29 are formed with the corrugated inner fins 20 which lead from the refrigerant tank 2 to the upper space 18, and the refrigerant passage 21 is larger in the cross section and smaller in the passage resistance than the refrigerant passage 29. In this construction, the refrigerant 10 passes mainly through the refrigerant passage 21 (the gasified refrigerant 10 is guided through the refrigerant passage 21 to the upper space 18). If there are a plurality of refrigerant passages uniformly formed with the corrugated inner fins 20, the refrigerant flows would collide against each other in the upper space 18. In this embodiment, however, as there is only on main refrigerant passage, there is no collision of the refrigerant flows in the upper space 18, and therefore the smooth refrigerant flow can be formed, and as the rising vapor flow increases, the heat flux also increases and the heat radiability can be improved. Furthermore, by the large vibration of the liquid pooling part 19, the heat transfer coefficient can be improved due to the resultant forced convection.

(Third Embodiment)

The third embodiment according to the present invention will next be described focusing on differences from the second embodiment.

Figure 14:
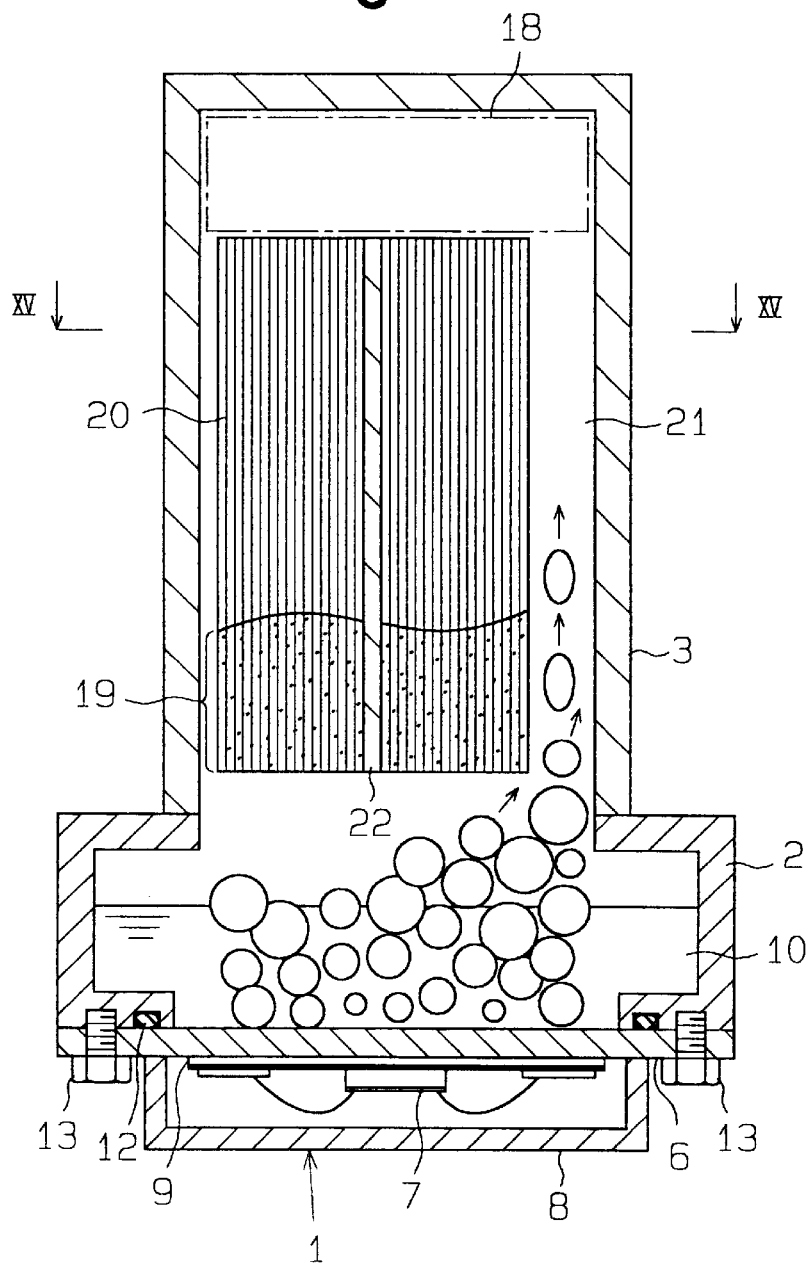
FIG. 14 is a cross-sectional view of a cooling apparatus using boiling refrigerant according to the third embodiment.
Figure 15:
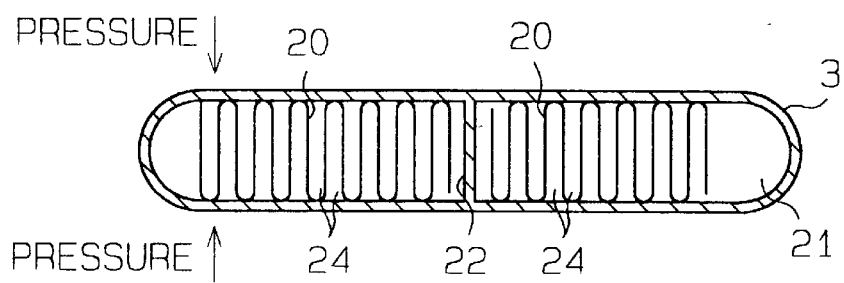
FIG. 15 is a cross-sectional view taken along line XV—XV of FIG. 14.

In this embodiment, as illustrated in FIGS. 14 and 15, a reinforcing member 22 is provided within the radiation tube 3. The corrugated inner fins 20 are bonded to the radiation tube 3 by means of brazing. At this time, pressure is applied to the radiation tube 3, and therefore, in order to prevent the warp of the radiation tube 3 due to the application of pressure, the reinforcing member 22 is provided therein. In this case, the reinforcing member 22 is provided as if to divide the corrugated inner fins 20 into two parts. As illustrated in FIG. 14, however, by the formation of the refrigerant passage 21, the circulation flow can be formed with rising vapor flow and returning liquid flow to effectively radiate the heat in the same manner as the second embodiment.

(Fourth Embodiment)

Now, the fourth embodiment will be described, and the description will be centered around differences from the second embodiment.

Figure 16:
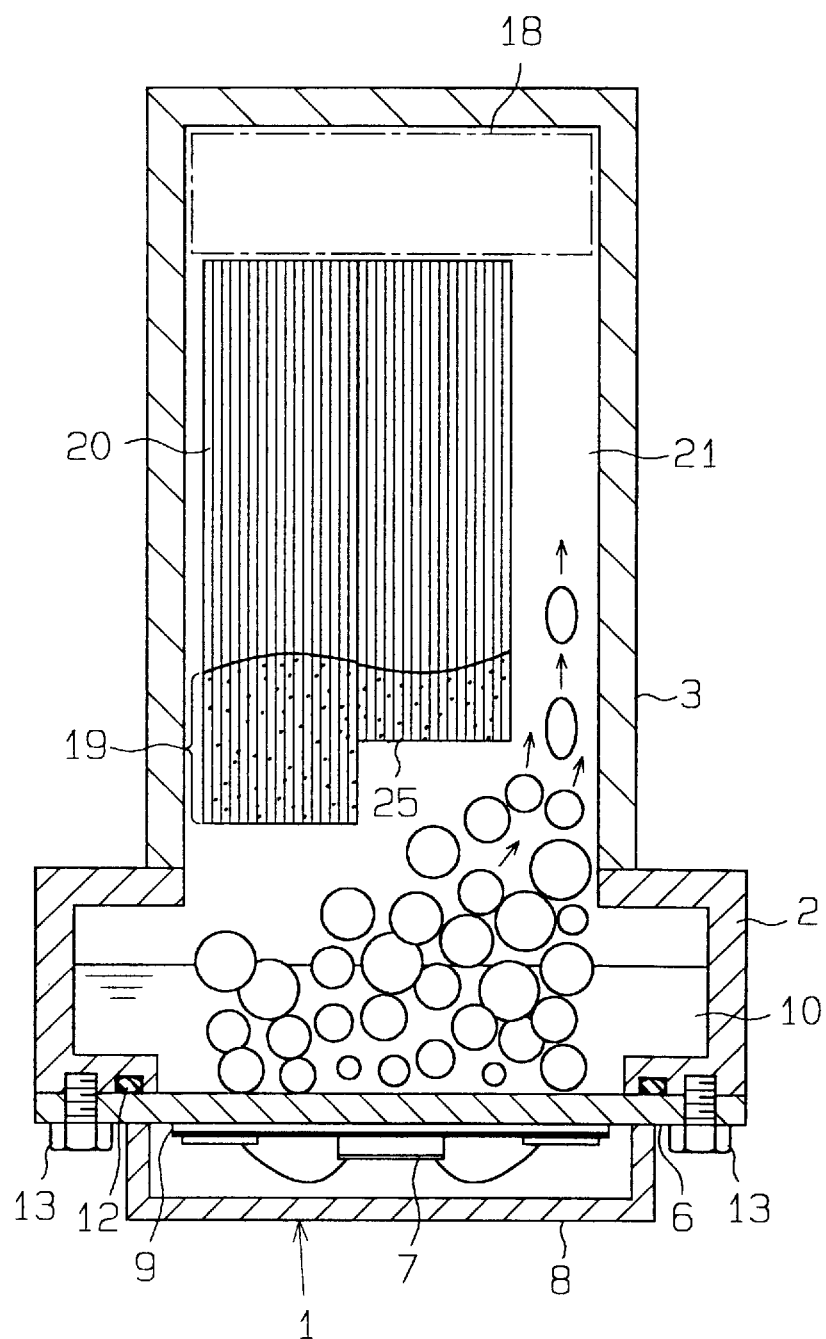
FIG. 16 is a cross-sectional view of a cooling apparatus using boiling refrigerant according to the fourth embodiment.

According to this embodiment, as illustrated in FIG. 16, a step part 25 is formed at a part of the corrugated inner fins 20 to set an lower end of the corrugated inner fin 20 upwards. The step part 25 is provided to widen the opening part of the refrigerant passage 21 on the side of the refrigerant tank 2 toward the side of the refrigerant tank 2. As the opening part of the refrigerant passage 21 formed with the corrugated inner fins 20 is widened on the side of the refrigerant tank 2 toward the side of the refrigerant tank 2 in this way, the refrigerant 10, which is gasified within the refrigerant tank 2 and rises thereto, is collected more at this part and guided into the refrigerant passage 21. Accordingly, the gasified refrigerant 10 can smoothly be guided into the refrigerant passage 21, the circulation flow with the rising vapor flow and returning liquid flow can easily be formed, and the heat radiability can further be improved.

Figure 17:
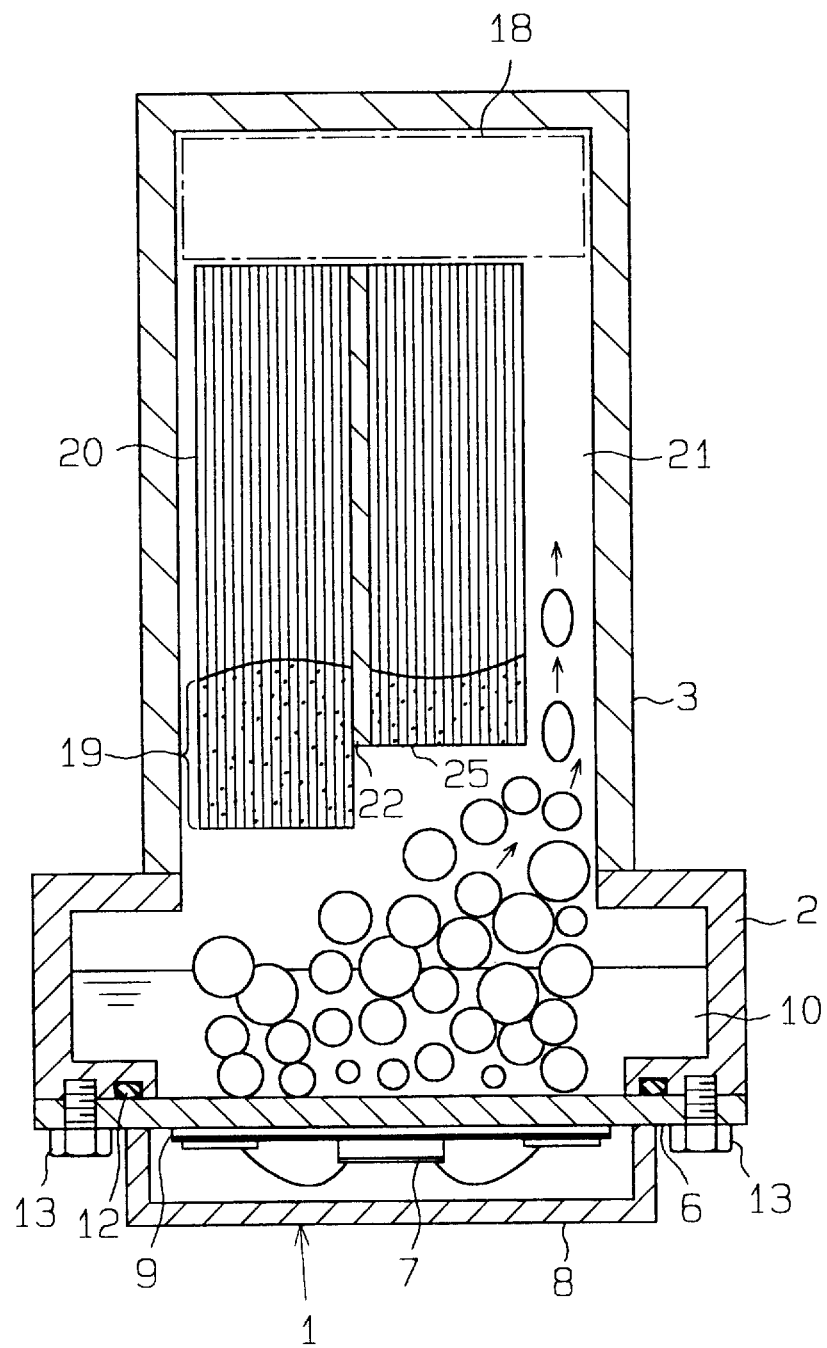
FIG. 17 is a cross-sectional view of a cooling apparatus using boiling refrigerant as a modification of the fourth embodiment.

As a modification of this embodiment, as illustrated in FIG. 17, the reinforcing member 22 may be provided.

(Fifth Embodiment)

Then, the fifth embodiment will be described mainly on differences from the second embodiment.

Figure 18:
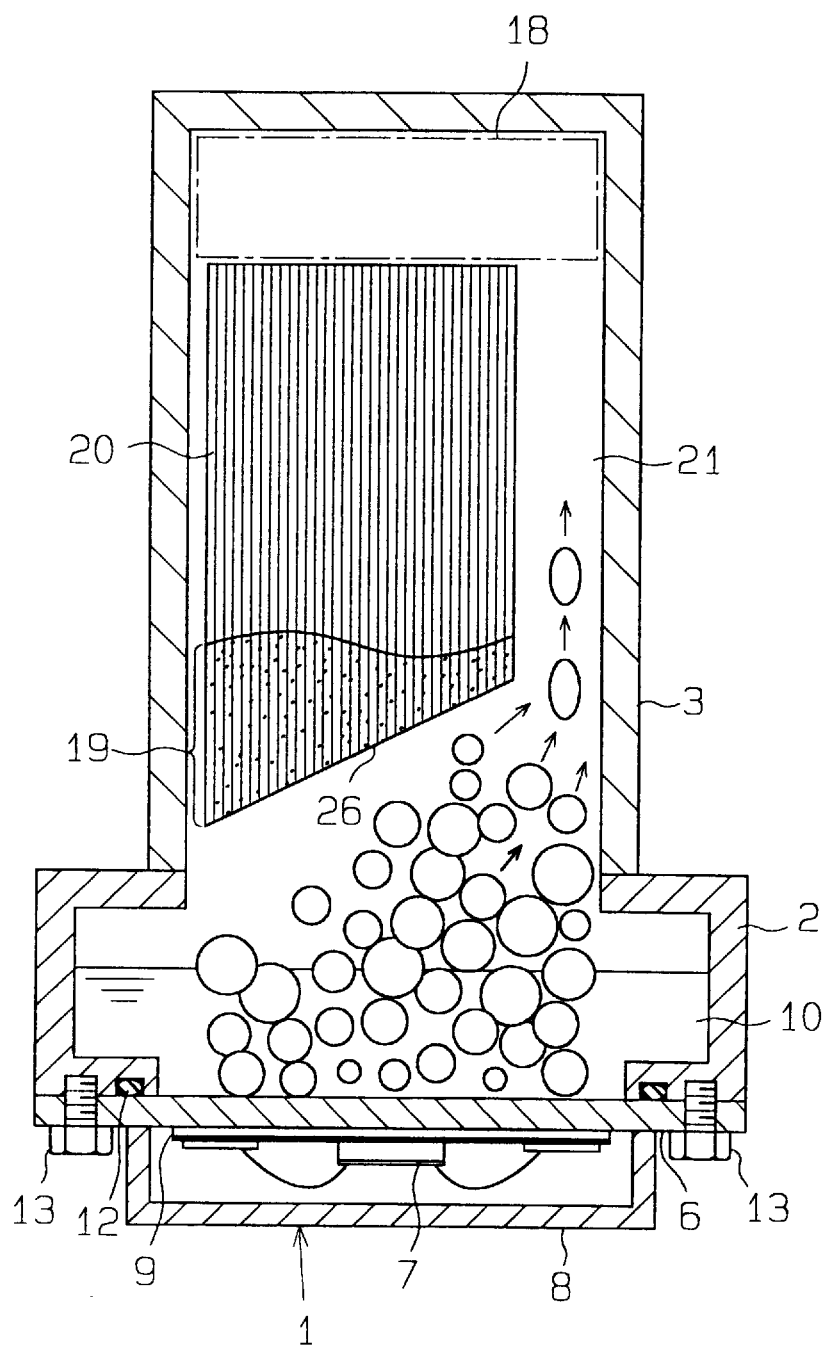
FIG. 18 is a cross-sectional view of a cooling apparatus using boiling refrigerant according to the fifth embodiment.
Figure 19:
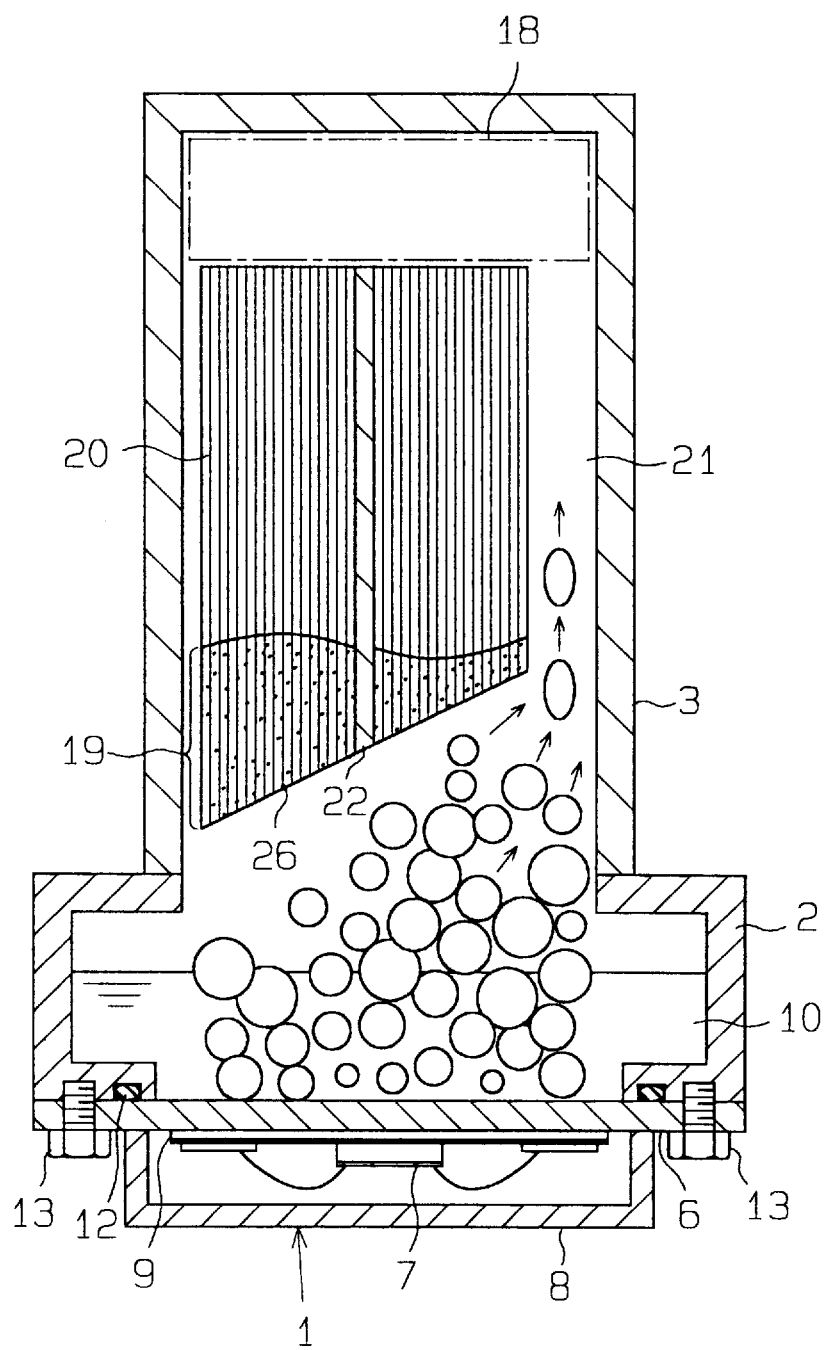
FIG. 19 is a cross-sectional view of a cooling apparatus using boiling refrigerant as a modification of the fifth embodiment.

In this embodiment, as illustrated in FIG. 18, a diagonal part 26 is formed at the lower end of the corrugated inner fins 20. The diagonal part 26 is provided to widen the opening part of the refrigerant passage 21 on the side of the refrigerant tank 2 toward the side of the refrigerant tank 2. As the opening part of the refrigerant passage 21 formed with the corrugated inner fins 20 is steplessly widened (tapered) on the side of the refrigerant tank 2 toward the side of the refrigerant tank 2 in this way, the refrigerant 10 which is gasified within the refrigerant tank 2 and rises thereto is collected more at this part and guided into the refrigerant passage 21. Accordingly, the gasified refrigerant 10 can smoothly be guided into the refrigerant passage 21, the circulation flow with the vapor rising flow and returning liquid flow can easily be formed, and the heat radiability can further be improved.

As a modification of this embodiment, as illustrated in FIG. 17, the reinforcing member 22 may be provided.

(Sixth Embodiment)

This time, description will be given to the sixth embodiment mainly referring to differences from the second embodiment.

Figure 20:
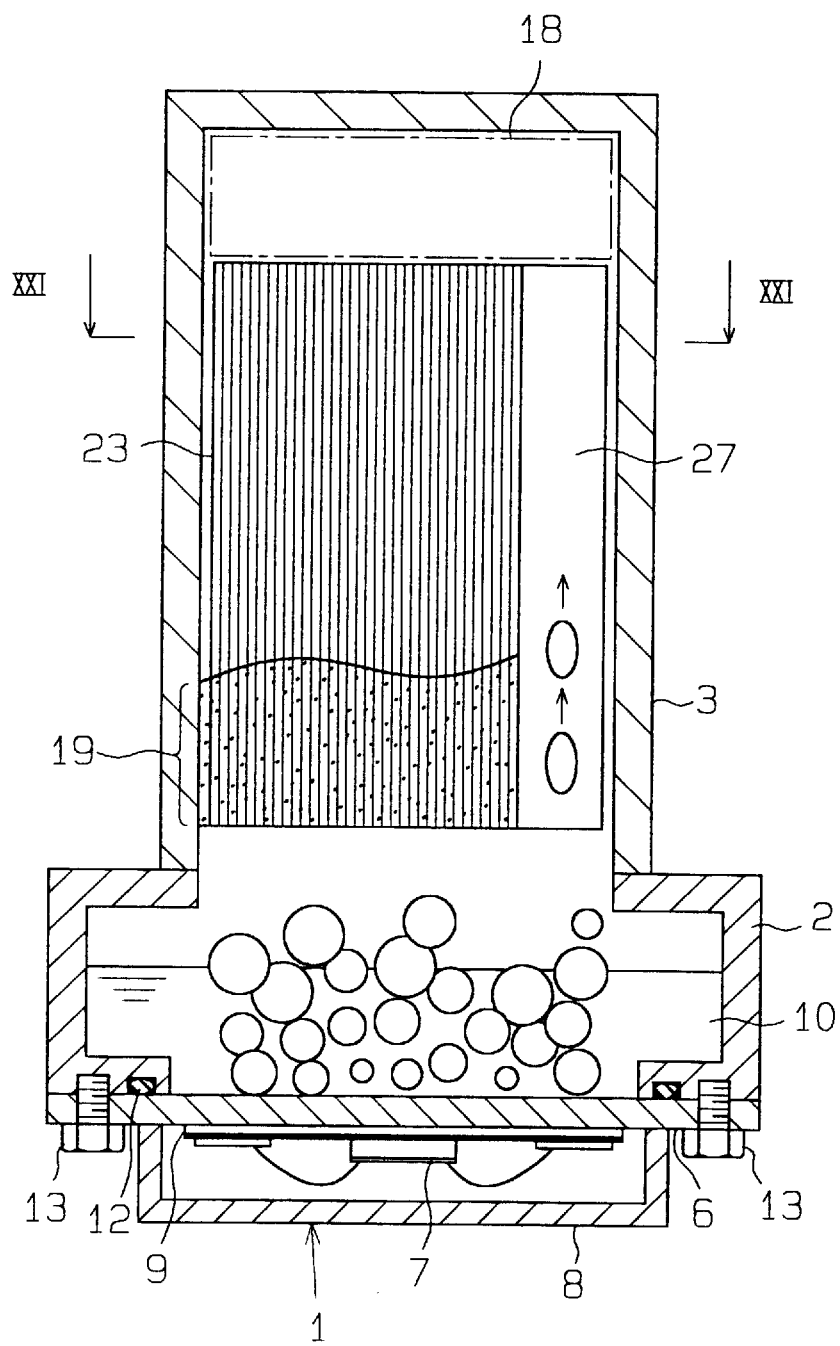
Figure 21:
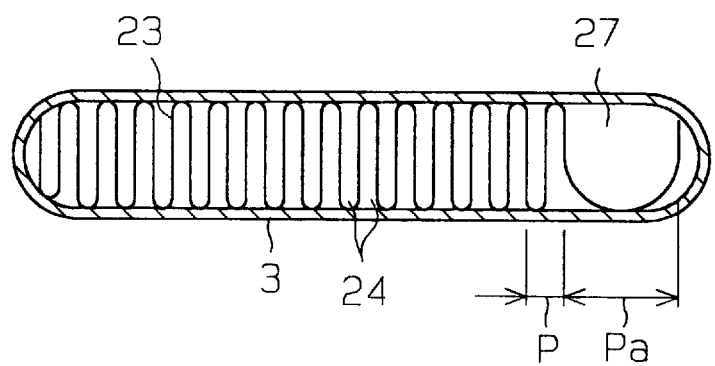
FIG. 21 is a cross-sectional view taken along line XXI—XXI of FIG. 20.

FIG. 20 is a counterpart of FIG. 8 of the second embodiment, and FIG. 21 is a cross-sectional view taken along line XXI—XXI of FIG. 20. Unevenly pitched inner fins 23 having a wide pitch is provided to the inner surface of the radiation tube 3 with the wider pitch part (pitch: Pa) at an end part, and this part provides a refrigerant passage 27 (first refrigerant passage). In this arrangement again, the vapor rises through the wide-pitch part (27), and the circulation flow is formed with the rising vapor flow and returning liquid flow. Furthermore, by the great vibration of the liquid pooling part 19, the heat can effectively radiated.

(Seventh Embodiment)

The seventh embodiment will now be described mainly as to differences from the second embodiment.

Figure 22:
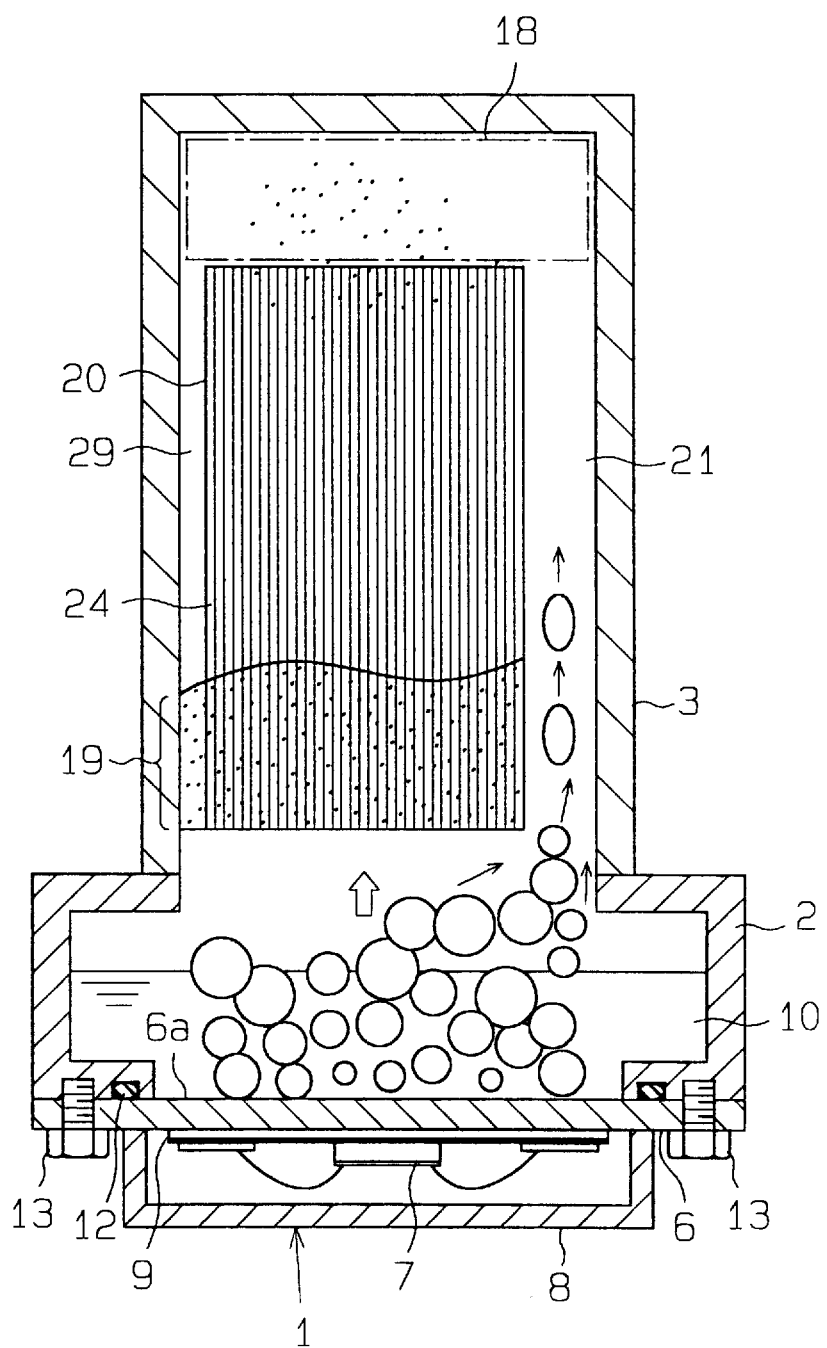
FIG. 22 is a cross-sectional view of a cooling apparatus using boiling refrigerant according to the seventh embodiment.

This embodiment is illustrated in FIG. 22. According to this embodiment, a clearance 29 at an end within the radiation tube 3 has a cross section which is larger than that of each thin hole 24 of the corrugated inner fins 20 but smaller than that of the refrigerant passage 21 and forms the liquid pooling part 19. Therefore, in this seventh embodiment, the first refrigerant passage is only the refrigerant passage 21 and the second refrigerant passage includes the thin holes 24 and the clearance 29. In this arrangement, there is only one refrigerant flow, and therefore there is no collision of the refrigerant flows in the upper space 18. Accordingly, more smooth circulation flow can be formed, liquid flow can smoothly be returned into the refrigerant tank 2, and the maximum heat transportation rate can further be increased.

According to this embodiment, there is only one refrigerant passage 21 formed with the corrugated inner fins 20 which lead from the refrigerant tanks 2 to the upper space 18, and the gasified refrigerant 10 is guided to the upper space 18 through this refrigerant passage 21. When there are a plurality of refrigerant passages formed with the corrugated inner fins 20, the refrigerant flows collide against each other in the upper space 18. In this embodiment, however, as there is only one refrigerant passage, there is no collision of the refrigerant flows in the upper space 18, smooth refrigerant flow can be formed, and as the rising vapor flow increases, the heat flux also increases, and the heat radiability can be improved. Furthermore, by the great vibration of the liquid pooling part 19, the heat transfer coefficient can be improved by the resultant forced convection.

As a modification of this embodiment, when there is only one refrigerant passage 21, the step part 25 of the fourth embodiment may be provided or the diagonal part 26 of the fifth embodiment may be provided.

(Eighth Embodiment)

Focusing on differences from the second embodiment, the eighth embodiment will be described.

Figure 23:
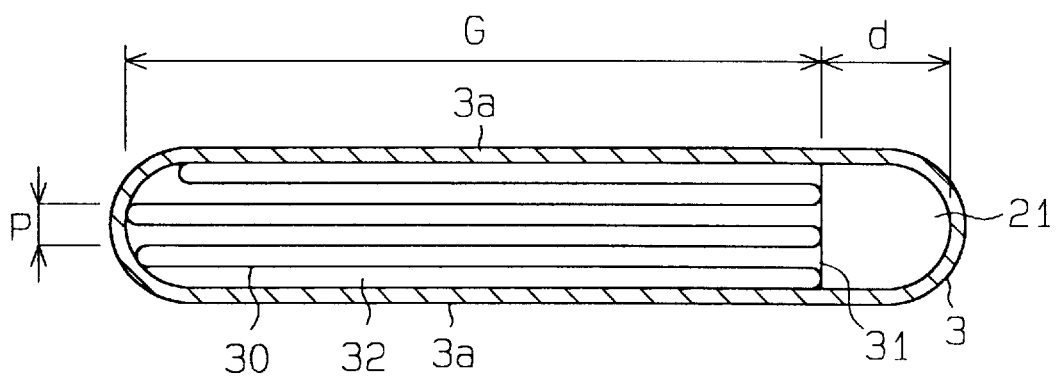
FIG. 23 is a cross-sectional view of a cooling apparatus using boiling refrigerant according to the eighth embodiment.

FIG. 23 illustrating the radiation tube 3 according to this embodiment is a countermeasure of FIG. 2 illustrating the second embodiment.

In this embodiment, within the radiation tube 3 are provided corrugated inner fins 30 and at the same time a partition plate 31 to separate the refrigerant passage 21 (first refrigerant passage) from the corrugated inner fins 30. The corrugated inner fins 30 are so disposed within the radiation tube 3 as to be parallel with the parallel parts 3a of the radiation tube 3. As a result, in thin holes 32 dividingly formed with the corrugated inner fins 30, the cross section of the passages of each thin hole 32 is roughly rectangular with one side of P/2 and the other side of G when the pitch (distance between the adjoining crests or roots) of the corrugated inner fin 30 is P and the overall length (distance between the adjoining crest and root) of the corrugated inner fin 30 is G, and the width of the narrowest part of the roughly rectangular part is P/2. Within these thin holes 32 is formed the liquid pooling part 19. Here, P/2 is smaller than the width d of the narrowest part of the refrigerant passage 21 at the cross section.

As described above, according to this embodiment, as the width (P/2) of the narrowest part of such thin hole 32 at the cross section as the second refrigerant passage is so arranged as to be narrower than the width (d) of the narrowest part of the first refrigerant passage 21 at the cross section, it is easy to form the liquid pooling part 19 in the thin holes 32.

As a modification of the present embodiment, it may be so constructed that a plurality of the first refrigerant passages are formed, a plurality of the thin holes 32 are formed as the second refrigerant passages, and the width of the narrowest part of each thin hole 32 at the cross section is narrower than the width of each first refrigerant passage. In this case, as the width (P/2) of the narrowest part of each second refrigerant passage is narrower than the width of each first refrigerant passage, the liquid pooling part 19 can easily be formed.

As another modification of the present embodiment, in addition to the above construction, the level difference part 25 of the fourth embodiment may be provided or the diagonal part 26 of the fifth embodiment may be provided.

It should be apparent to those skilled in the art that the present invention should not be limited to the above each embodiment but may be embodied in may other forms without departing from the spirit or the scope of the invention. For example, instead of the corrugated inner fins 14, 20 and 23, corrugated fins in the stacked state may be arranged within the radiation tube 3, and in this case again, the thin holes extending in the direction in which the radiation tube 3 extends are formed.

Furthermore, instead of the corrugated inner fins 14, 20 and 23, a honeycomb material having a high heat conductivity may be arranged within the radiation tube 3. In this case again, the thin holes extending in the direction in which the radiation tube 3 extends are formed.

As described above in detail, according to the present invention, the present invention has an excellent effect that the liquid flow can smoothly return and the maximum heat transportation rate can be increased.

What is claimed is:

1. A cooling apparatus for using boiling and condensing refrigerant, said cooling apparatus comprising:
    a heating element for generating heat due to electric energizing thereof;
    a refrigerant tank for reserving refrigerant which absorbs heat emitted by said heating element and is gasified by the heat at a gasify surface of said reserved refrigerant;
    a radiation part of which one end communicates with said refrigerant tank and the other end is closed, said radiation part being for condensing the gasified refrigerant and returning the same into said refrigerant tank; and
    refrigerant passage forming members composed of sheet members arranged within said radiation part for defining, in cooperation with said radiation part, an upper space which is a space at an upper part of said radiation part, a first refrigerant passage which guides the gasified refrigerant from said refrigerant tank into said upper space and a second refrigerant passage which returns the gasified refrigerant from said upper space into said refrigerant tank as liquefied refrigerant along a return path and in which a liquid pooling part is formed on said return path with the liquefied refrigerant, said second refrigerant passage communicating with said first refrigerant passage only at said upper part and at said liquid pooling part, a cross-sectional area of said second refrigerant passage being smaller than a cross-sectional area of said first refrigerant passage;
    wherein said second refrigerant passage has an upper open part which is disposed in said upper space and a bottom open part which is disposed proximate to said gasify surface, said refrigerant passage forming members extending from said upper space to said liquid pooling part;
    a bottom of said liquid pooling part is formed in said bottom open part and directly faces said gasify surface; and
    pooled refrigerant in said liquid pooling part vibrates up and down due to refrigerant from said gasify surface directly contacting said bottom of said liquid pooling part.

2. The cooling apparatus according to claim 1, wherein said second refrigerant passage is narrower in the width of the narrowest part of the cross section than said first refrigerant passage.

3. The cooling apparatus according to claim 1, wherein a plurality of said first refrigerant passages are formed, a plurality of said second refrigerant passages are formed and any one of said second refrigerant passages is smaller in cross section than any one of said first refrigerant passages.

4. The cooling apparatus according to claim 1, wherein a plurality of said first refrigerant passages are formed, a plurality of said second refrigerant passages are formed and any one of said second refrigerant passages is smaller in the width of the narrowest part of the cross section than any one of said first refrigerant passages.

5. The cooling apparatus according to claim 1, wherein a plurality of the first refrigerant passages are formed and one of the first refrigerant passages is smaller in passage resistance than any other first refrigerant passage.

6. The cooling apparatus according to claim 1, wherein a plurality of said first refrigerant passages are formed and one of said first refrigerant passages is larger in cross section than any other first refrigerant passage.

7. The cooling apparatus according to claim 1, wherein only one first refrigerant passage is formed.

8. The cooling apparatus according to claim 1, wherein said refrigerant passage forming members are composed of corrugated fins.

9. The cooling apparatus according to claim 1, wherein said first refrigerant passage has on the side of the refrigerant tank an opening part which is wider toward a side of the refrigerant tank.

10. The cooling apparatus according to claim 1, wherein said first refrigerant passage has on the side of the refrigerant tank an opening part which is tapered toward a side of the refrigerant tank.

11. A cooling apparatus for using boiling and condensing refrigerant, said apparatus comprising:
    a heating element for generating heat due to electric energizing thereof;
    a refrigerant tank for reserving refrigerant which absorbs heat emitted by said heating element and is gasified by the heat at a gasify surface of said reserved refrigerant;
    a radiation part of which one end communicates with said refrigerant tank and the other end is closed, said radiation part being for condensing the gasified refrigerant and returning the same into said refrigerant tank;
    refrigerant passage forming members arranged within said radiation part for defining, in conjunction with said radiation part, an upper space which is a space at an upper part of said radiation part, a first refrigerant passage which guides the gasified refrigerant from said refrigerant tank into said upper space and a second refrigerant passage which returns the gasified refrigerant from said upper space into said refrigerant tank as liquefied refrigerant along a return path and in which a liquid pooling part is formed on said return path with the liquefied refrigerant, said second refrigerant passage communicating with said first refrigerant passage only at said upper part and at said liquid pooling part, a cross-sectional area of said second refrigerant passage being smaller than a cross-sectional area of said first refrigerant passage;
    wherein said second refrigerant passage has an upper open part which is disposed in said upper space and a bottom open part which is disposed proximate to said gasify surface;
    a bottom of said liquid pooling part is formed in said bottom open part and directly faces said gasify surface; and
    pooled refrigerant in said liquid pooling part vibrates up and down due to refrigerant from said gasify surface directly contacting said bottom of said liquid pooling part.

* * * * *